US007108606B1

(12) United States Patent
Luciano et al.

(10) Patent No.: US 7,108,606 B1
(45) Date of Patent: Sep. 19, 2006

(54) LOCKABLE SECURITY CABINET FOR CASINO GAME CONTROLLERS

(75) Inventors: Robert A. Luciano, Reno, NV (US); Michael Souza, Reno, NV (US); Kurt W. Spencer, Reno, NV (US)

(73) Assignee: Sierra Design Group, Las Vegas, NV (US)

( * ) Notice: Subject to any disclaimer, the term of this patent is extended or adjusted under 35 U.S.C. 154(b) by 0 days.

(21) Appl. No.: 11/134,903

(22) Filed: May 23, 2005

Related U.S. Application Data

(63) Continuation of application No. 10/619,167, filed on Jul. 11, 2003, now Pat. No. 6,896,620, which is a continuation of application No. 09/642,550, filed on Aug. 17, 2000, now Pat. No. 6,641,483.

(60) Provisional application No. 60/191,898, filed on Mar. 23, 2000, provisional application No. 60/153,895, filed on Sep. 14, 1999, provisional application No. 60/149,522, filed on Aug. 17, 1999, provisional application No. 60/149,525, filed on Aug. 17, 1999.

(51) Int. Cl.
*A63F 9/24* (2006.01)
*H05K 7/00* (2006.01)
*H05K 5/00* (2006.01)

(52) U.S. Cl. ........................................ 463/46; 361/679

(58) Field of Classification Search .................... 463/1, 463/12–13, 16–20, 25, 40–42, 47; 273/143 R, 273/309; 312/291, 294, 406; 700/231, 237, 700/242; 361/679, 686, 724, 727, 752, 759; 70/78, 266, 278.2, 336–337, 432

See application file for complete search history.

(56) References Cited

U.S. PATENT DOCUMENTS

| | | | | |
|---|---|---|---|---|
| 1,436,925 | A | | 11/1922 | Wege et al. |
| 3,727,439 | A | | 4/1973 | Parrock |
| 3,837,196 | A | | 9/1974 | Gartner et al. |
| 4,440,457 | A | | 4/1984 | Fogelman et al. |
| 4,455,846 | A | | 6/1984 | Wichinsky |
| 4,562,708 | A | | 1/1986 | Gros |
| 4,614,342 | A | * | 9/1986 | Takashima ................... 463/11 |
| 4,658,956 | A | | 4/1987 | Takeda et al. |
| 4,714,030 | A | | 12/1987 | Cole |
| 4,782,676 | A | | 11/1988 | Friedman |
| 5,048,717 | A | | 9/1991 | Falk et al. |
| 5,172,967 | A | | 12/1992 | Pipe |
| 5,221,083 | A | * | 6/1993 | Dote ........................... 463/32 |

(Continued)

*Primary Examiner*—Mark Sager
(74) *Attorney, Agent, or Firm*—Brown Raysman Millstein Felder & Steiner LLP

(57) ABSTRACT

A lockable security cabinet for game controllers of the type used to operate electronic slot and card games in gambling casinos. The cabinet includes multiple key locking doors and key operated control switches to allow access to specific areas and controls of a main cabinet thereof housing the computers and other electronics only by authorized persons having the proper key for reach particular area or control switch. The cabinet is slidably mounted of a locking base which bolts into a recess in a gaming table allowing the main cabinet to also be recessed therein yet slide out in a cantilevered fashion to access the doors and controls. The base includes a side or rear cable locking enclosure allowing access to an disconnecting of ends of cable connected to the game controller only upon unlocking of the base and outward sliding of the main cabinet.

39 Claims, 10 Drawing Sheets

U.S. PATENT DOCUMENTS

| | | | | |
|---|---|---|---|---|
| 5,344,046 | A | 9/1994 | Maldanis et al. | |
| 5,375,708 | A | 12/1994 | Wittman | |
| 5,405,193 | A | 4/1995 | Herrenbruck | |
| 5,515,959 | A * | 5/1996 | Stephenson et al. | 194/206 |
| 5,520,450 | A | 5/1996 | Colson, Jr. et al. | |
| 5,701,828 | A | 12/1997 | Benore et al. | |
| 5,732,878 | A | 3/1998 | Schroder et al. | |
| 5,787,737 | A | 8/1998 | Cho | |
| 5,905,653 | A | 5/1999 | Higham et al. | |
| 6,012,941 | A | 1/2000 | Burdenko et al. | |
| 6,129,029 | A | 10/2000 | Watson | |
| 6,170,304 | B1 | 1/2001 | Ohta | |
| 6,189,727 | B1 | 2/2001 | Shoenfeld | |
| 6,201,703 | B1 | 3/2001 | Yamada et al. | |
| 6,231,446 | B1 | 5/2001 | Majima et al. | |
| 6,272,394 | B1 | 8/2001 | Lipps | |
| 6,354,122 | B1 | 3/2002 | Snoke | |
| 6,385,505 | B1 | 5/2002 | Lipps | |
| 6,418,014 | B1 | 7/2002 | Emerick, Jr. | |
| 6,464,586 | B1 * | 10/2002 | Kamata et al. | 463/46 |
| 6,641,483 | B1 * | 11/2003 | Luciano et al. | 463/46 |
| 6,682,156 | B1 | 1/2004 | Herrington | |
| 6,726,294 | B1 | 4/2004 | Muller et al. | |
| 6,896,620 | B1 * | 5/2005 | Luciano et al. | 463/46 |
| 2002/0147598 | A1 | 10/2002 | Smith et al. | |

* cited by examiner

FIG. 1
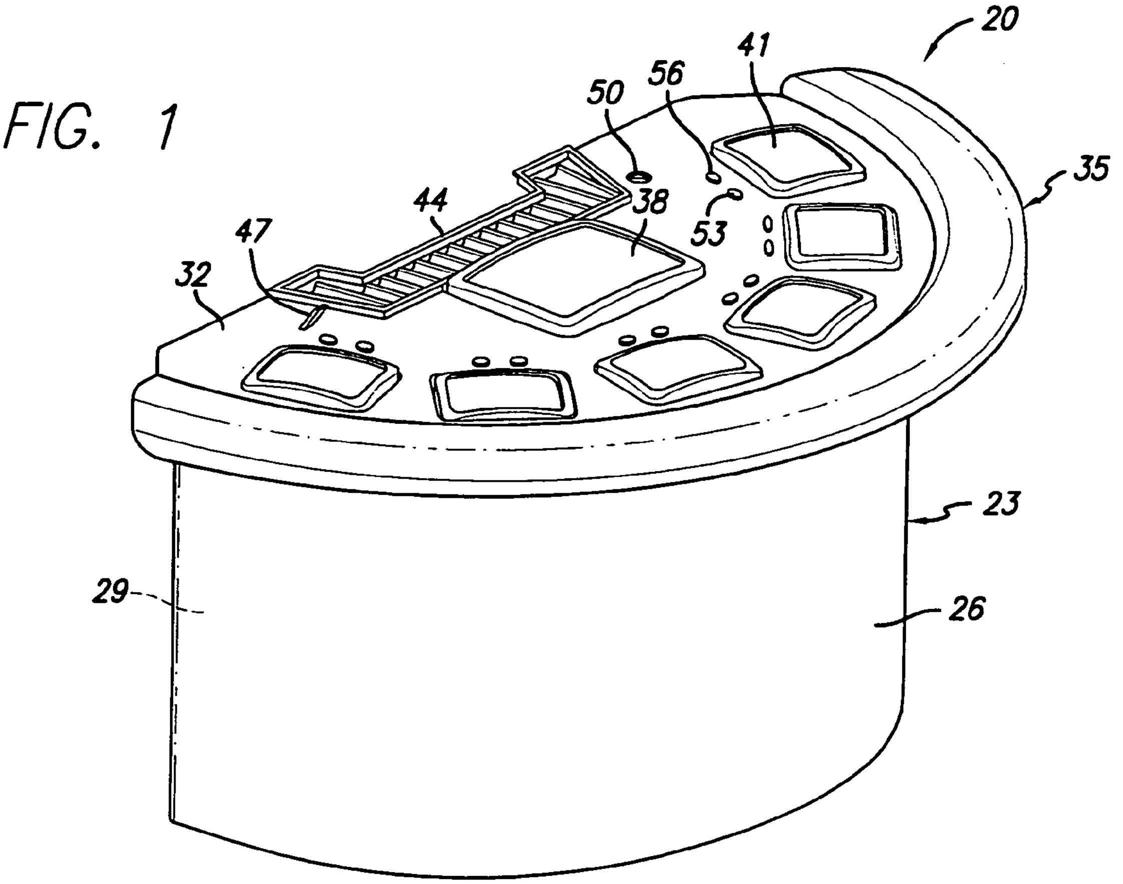
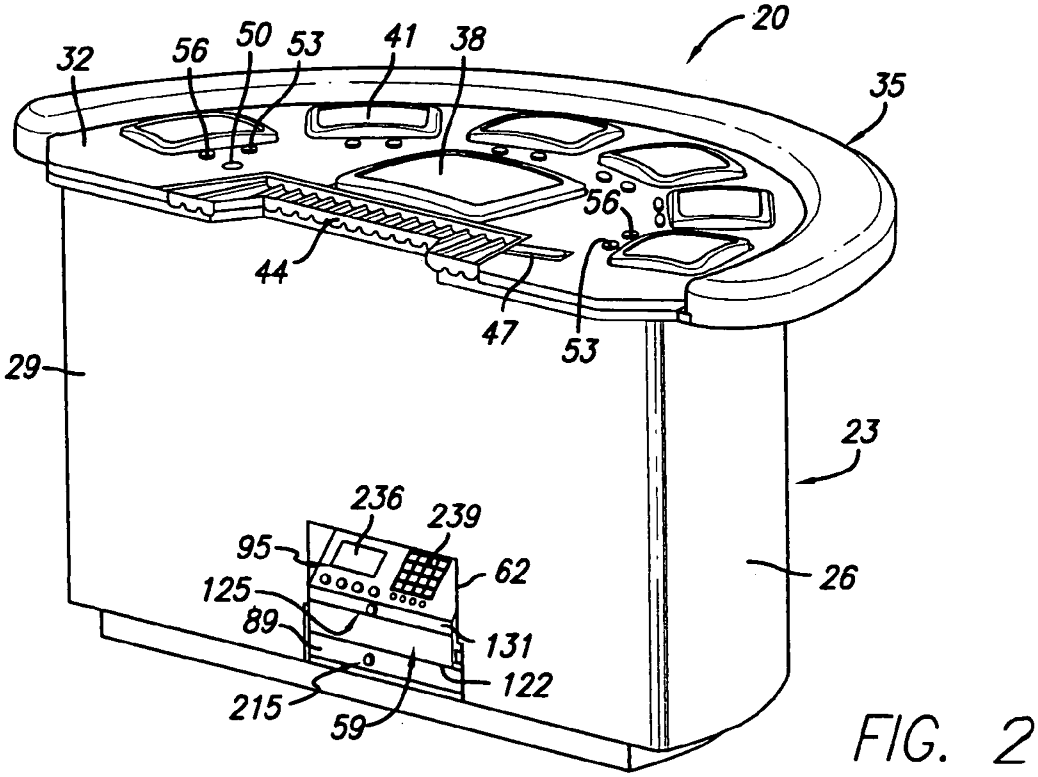
FIG. 2

LOCKABLE SECURITY CABINET FOR CASINO GAME CONTROLLERS

CROSS REFERENCES TO RELATED APPLICATIONS

This patent application is a continuation of U.S. application Ser. No. 10/619,167 filed Jul. 11, 2003, now U.S. Pat. No. 6,896,620 issued May 24, 2005, which is a continuation of U.S. application Ser. No. 09/642,550 filed Aug. 17, 2000, now U.S. Pat. No. 6,641,483 issued Nov. 4, 2003, which claims benefit of U.S. Application No. 60/149,522 filed Aug. 17, 1999; U.S. Application No. 60/149,525 filed Aug. 17, 1999; U.S. Application No. 60/153,895 filed Sep. 14, 1999; and U.S. Application No. 60/191,898 filed Mar. 23, 2000, all which are hereby incorporated by reference in their entirety.

BACKGROUND OF THE INVENTION

1. Field of Invention

The invention relates to game controllers for electronic gaming tables and devices, and more particularly to security enclosures and cabinets for such game controllers.

2. Description of Related Art

Modern casinos have a wide variety of gaming devices to entertain patrons and produce revenue. These gaming devices may include electromechanical slot machines and a variety of manually dealt card games such as poker, twenty-one, roulette, baccarat, and the like. In recent years, electronic versions of such games have replaced many of the manual versions. For example, many slot machines utilize electronic versions of spinning reels. These reels may be reproduced on a video display that is controlled by a video controller. Likewise, all of the major card games now appear in electronic form on similar video displays.

A controller generally operates electronic gaming devices. The controller can be built into the cabinet or housing of the gaming device or it can be connected to the gaming device from a remote location, such as a control room, by one or more cables. Game controllers can also be used to control a number of different gaming devices. For example, casino-type lottery systems generally utilize a number of separate gaming devices on the floor of a casino. The gaming devices request game outcomes from a central controller. The central game controller stores one or more pools of game outcomes that are transmitted to the gaming devices when appropriate.

One problem with electronic controllers is that various casino personnel need to access different portions and controls of the game controller at various times. However, because of the need for strict security in a gaming environment, it is often necessary to restrict access to sensitive components of the controller. For example, an operator might require only access to control certain game functions necessary to keep play going, while a management person might be the proper person to access more basic functions, such as resetting the game controller, and only maintenance personnel might be qualified to work on the electronics of the game controller. Likewise, the cable assemblies that connect the game controller to the gaming device being controlled tend to be loosened, removed, or stolen from time-to-time. Therefore, it is also desirable to restrict access to the cable assemblies to specifically authorized persons.

SUMMARY OF INVENTION

1. Advantages of the Invention

The lockable security cabinet for game controllers provides multiple levels of security wherein only authorized persons can access specific controls, electronics, and cable connections of the game controller. The security cabinet further provides convenient access to the game controller electronics and cable assemblies by means of the slide-out design of the main cabinet with the base recessed in the gaming table or other enclosure, a plurality of access doors, and the slide opening design of the cable enclosure.

These and other advantages of the present invention may be realized by reference to the remaining portions of the specification, claims, and abstract.

2. Brief Description of the Invention

The invention is a lockable security cabinet for game controllers such as used in gambling casinos to operate and control one or more gaming terminals. The security cabinet houses the electronics of the game controller, and the cable connectors at one end of respective cable assemblies connected thereto for communications with external devices. The security cabinet comprises a main cabinet having a plurality of interconnected walls defining an enclosable inner compartment for housing the electronic components of the game controller, and one or more lockable access devices, typically comprising one or more key switches which control access to specific game controller functions, and/or one or more lockable access members such as key lockable doors pivotally connected to the main cabinet. Each access member is movable upon unlocking thereof to provide access to at least a portion of the electronic components of the game controller within the main cabinet, preferably an access member disposed at the top of the main cabinet for access to the processor boards and the power supply, and an access member disposed at the front of the main cabinet for access to the user accessible components (i.e. those components of the game controller which must be accessed on a regular basis) such as keyboard and monitor ports which allow a keyboard and a monitor to be connected to the game controller to program, operate, and maintain the game controller. Other such user accessible components include ports for memory devices such as ROM cards, flash memory cards, and communications devices.

An access member can also be movably connected to the main cabinet to control access to the connection and disconnection of cable assemblies. This access member for the cables preferably comprises a portion of a base on which the main cabinet is movably mounted such as for sliding in a front-to-rear direction. The portion of the base, such as comprising an enclosure structure, preferably is at a rear portion of the base for connection of the cable assemblies at the rear of the main cabinet or at a side portion of the base for connection of the cables assemblies at the side of the main cabinet, in both cases with the cables exiting rearwardly therefrom, so as to substantially enclose and retain the connector of the cable assemblies connected to the game controller. The cable of the cable assembly attached thereto extends through an elongate gap while the main cabinet is in a retracted, or closed position on the base. The main cabinet is lockable in such a closed position by means of a key lock. A rear cable guide bracket can be affixed to the rear of the main cabinet for guiding cable assemblies during forward and backward movement of the main cabinet on the base. Other types of cables which can be locked include Ethernet, parallel, various communication, VGA (video), coax, audio, etc. Typically, to provide the various levels of security, each key lock requires a different key to unlock.

The above description sets forth, rather broadly, the more important features of the present invention so that the detailed description of the preferred embodiment that follows may be better understood and contributions of the present invention to the art may be better appreciated. There are, of course, additional features of the invention that will be described below and will form the subject matter of claims. In this respect, before explaining at least one preferred embodiment of the invention in detail, it is to be understood that the invention is not limited in its application to the details of the construction and to the arrangement of the components set forth in the following description or as illustrated in the drawings. The invention is capable of other embodiments and of being practiced and carried out in various ways. Also, it is to be understood that the phraseology and terminology employed herein are for the purpose of description and should not be regarded as limiting.

BRIEF DESCRIPTION OF THE DRAWINGS

FIG. 1 is substantially a front perspective view of a typical electronic gaming table of the type wherein a game controller can be housed in a security cabinet of the invention;

FIG. 2 is substantially a rear perspective view of such electronic gaming table showing a first embodiment security cabinet of the invention having a rear cable enclosure structure, as mounted in a recess therein;

DESCRIPTION OF THE PREFERRED EMBODIMENT

Figure 3:
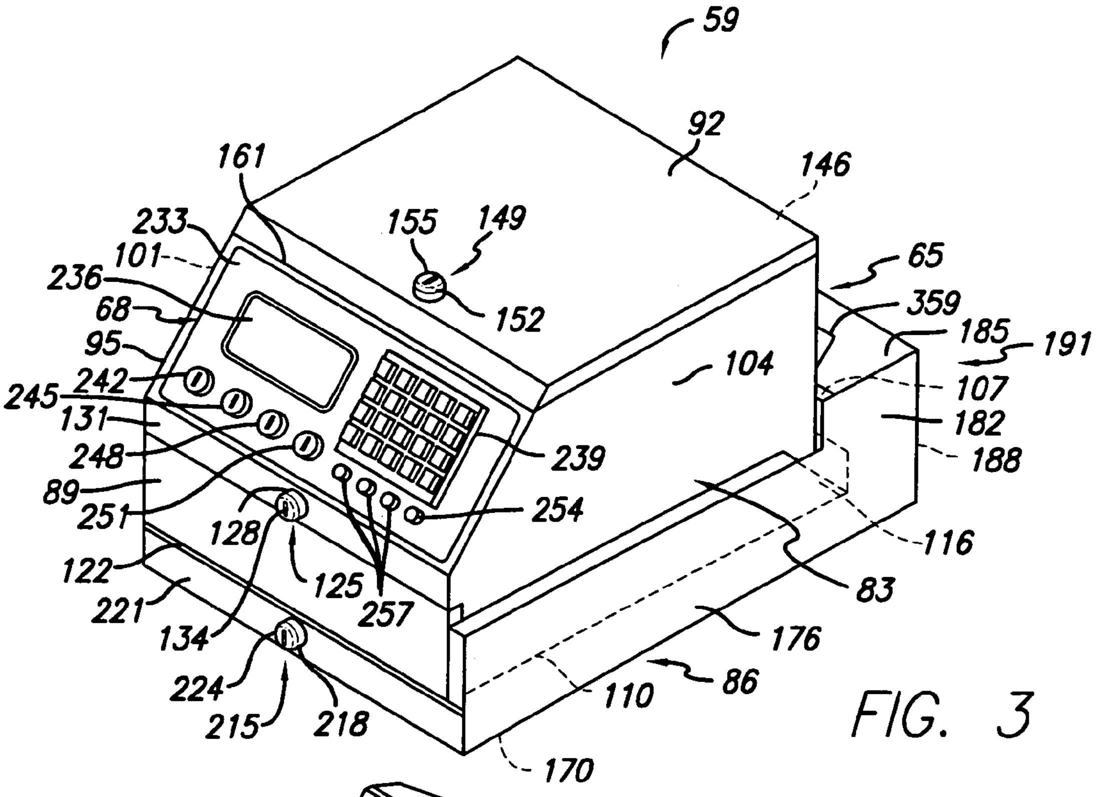
FIG. 3 is substantially a front perspective view of such first embodiment security cabinet.

Referring to FIGS. 1 and 2 therein is shown a typical electronic gaming table used in modern casinos of the type that can use the locking controller box of the present invention. Electronic gaming table 20 is used, for example, to play an electronic version of the card game twenty-one. Gaming table 20 comprises an upstanding, semi-cylindrical frame 23 having an arcuate wall 26 around which the players (not shown) stand or sit, a flat wall 29 adjacent which the dealer (not shown) stands, and a semi-circular table top 32 having an arcuate padded rail or rim 35 along the perimeter thereof. Extending through table top 32 is a dealer's video display 38, typically being a cathode ray tube (CRT), which is centrally located on table top 32, and a plurality of player's video displays 41, also typically being of the CRT type, in an arcuate line adjacent padded rim 35 of table top 32. A plurality of virtual cards (not shown) are presented on the dealer's video display 38 and on the player's video displays 41, the virtual cards being electronic versions of regular playing cards, dealt from a virtual card deck (not shown) such as generated by a random number generator (not shown). The dealer's video display 35 and the player's video displays 41 can be covered with a polarized light filter or other such privacy filter or mechanical shield (not shown) which limits the visual range in which the dealer's and player's video displays 38 and 41 can be viewed by adjacent players, the dealer, and other such persons.

The gaming table 20 further comprises a centrally located chip tray 44 for holding the dealer's chips (not shown), a bill slot 47 for the dealer to place paper money into given by the players in exchange for chips, and a chip slot 50 for placing chips. The central chip tray 44 allows easy use of the chips so there is minimal disruption of the game as it is played, and the various bets are collected or paid. Other versions of gaming table 20 can accept cash, credit and debit cards, or VIP cards with a given cash value used in place of chips for betting. The dealer's video display 38 and the player's video displays 41 can be of the touch screen type. Adjacent each player's video display 38 is a first spot 53 associated with a respective proximity sensor (not shown) such as of the capacitive, radio frequency, optical, or pressure sensitive type mounted beneath table top 32 to sense when chips have been bet and the position active so as to deal virtual cards on the respective player's displays 38. The gaming table 20 can therefore know whether a given player's station will participate in the next gaming round. Also adjacent each player's video display 38 is a second spot 56 also associated with a respective proximity sensor (not shown) of a similar type to sense when one or more chips have been bet such as for side bets. A first version game controller 59 incorporating a first embodiment security cabinet of the invention is mounted in a recess 62 through flat wall 29 of frame 23. Game controller 59 houses the electronic components (not shown) which make the game work.

It is to be understood that game table 20 is only one application for the game controller 59. Many other uses are possible. For example, game controller 59 may be linked to a plurality of different gaming devices (not shown) by cables. In this application, game controller 59 may be placed on a table or stand.

Referring to FIG. 3 therein is shown a first version game controller 59 which comprises a first embodiment security cabinet 65, a control panel 68, a main circuit board 71, a central game server (CGS) computer module 74, a central accounting server (CAS) computer module 77, and a power supply 80. Security cabinet 65 comprises a main cabinet 83, a base 86, a ROM door or front access door 89, and a processor board door or top access door 92. Main cabinet 83 includes a sloped front wall 95 having a rectangular opening 98, a pair of side walls 101 and 104, a rear wall 107, a bottom wall 110 interconnecting side walls 101 and 104, a transverse mounting wall 113, a rearwardly extending portion 116, and a power supply support 119.

Front access door 89 is pivotally mounted to bottom wall 110 by means of a first piano hinge 122 and which is retainable in a closed position by means of a first rotary key lock 125 having a body 128 mounted to a vertical face 131 of front wall 95, and having a rotatable cylinder 134 into which a key (not shown) is inserted. A locking tab 137 rotates with cylinder 134 into a corresponding slot 140 of an upper cross member 143 of front access door 89 to lock front access door 89. Top access door 92 is pivotally mounted to rear wall 107 by means of a second piano hinge 146, and is retainable in a closed position by means of a second rotary key lock 149 having a body 152 mounted to top access door 92. A rotatable cylinder 155 includes an attached locking tab 158 which rotates to a position under an edge portion 161 of front wall 95 to lock top access door 92. A retaining strap (not shown) retains top access door 92 in the open position Base 86 comprises a lower wall 170 which interconnects a pair of side walls 173 and 176 having respective upwardly extending rear portions 179 and 182 which are interconnected by a partial top wall 185 and a rear wall 188 so as to comprise a cable enclosure structure 191. Main cabinet 83 is slidably mounted to base 86 by means of a pair of slides such as ball bearing drawer slides 194 and 197 having respective upper slide members 200 and 203 and lower slide members 206 and 209, upper slide members 200 and 203 being affixed to the exterior of respective side walls 101 and 104 of main cabinet 83, and lower slide members 206 and 209 being affixed to the interiors of respective side walls 145 and 148 of base 86. Main cabinet 83 can be retained in a closed position, wherein main cabinet 83 is enclosed except for a cable gap "G" (FIG. 8) between a front edge 212 of partial top wall 185 and rear wall 188 of base 86, by means of a third rotary key lock 215 having a body 218 mounted to an upstanding front lip 221 of lower wall 170 and having a rotatable cylinder 224 with attached locking tab 227 which rotates into a transverse slot 230 through bottom wall 110 of main cabinet 83.

Figure 4:
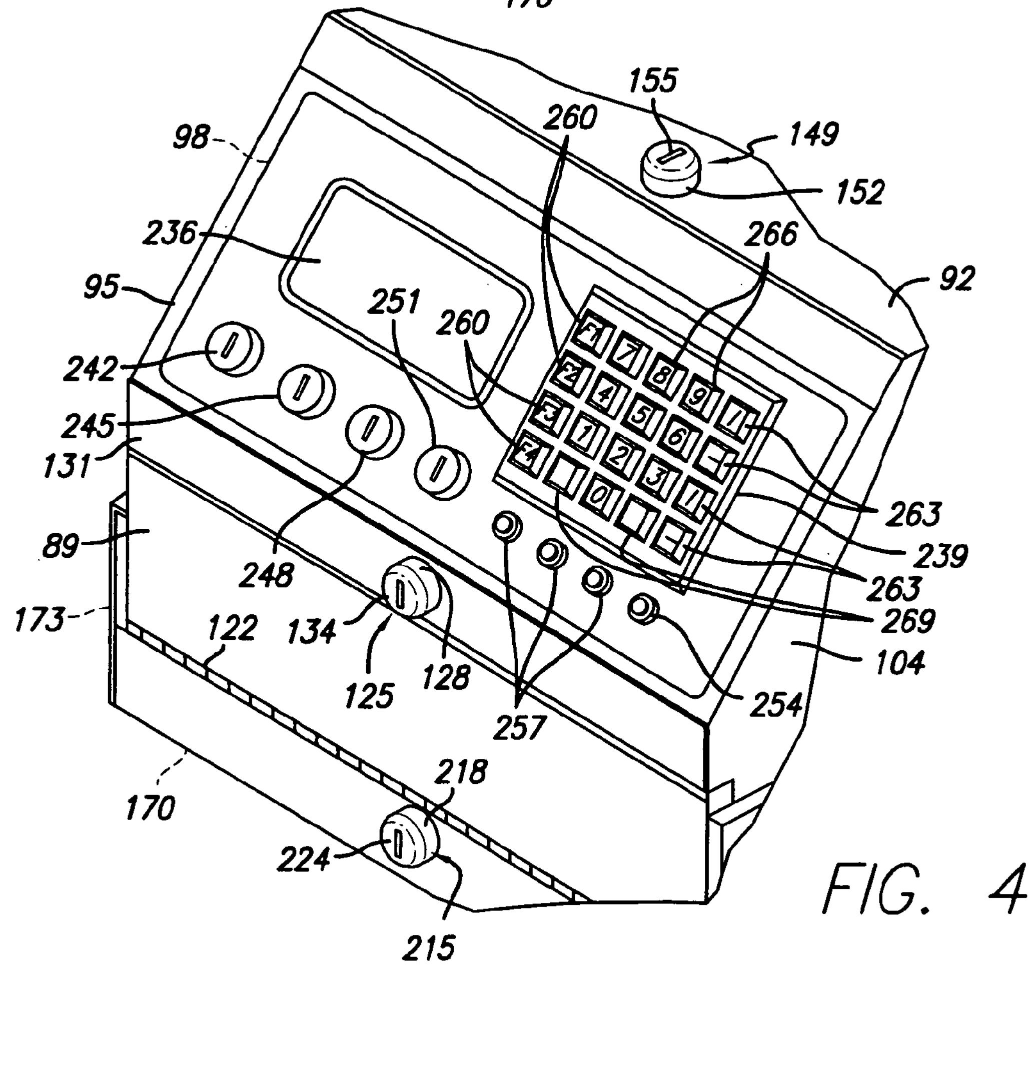
FIG. 4 is substantially a fragmentary front perspective view showing the details of the control panel.
Figure 5:
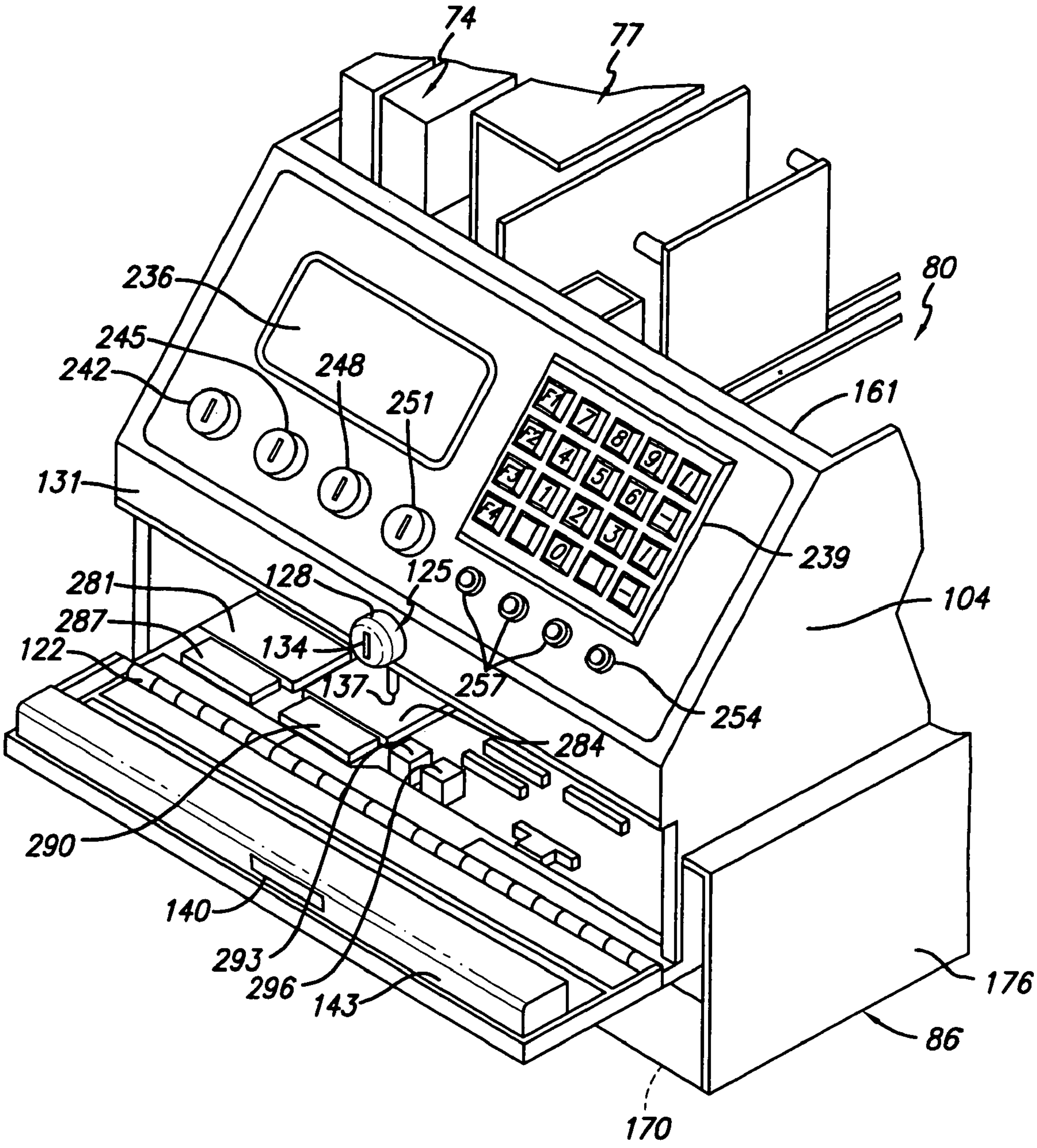
FIG. 5 is substantially a fragmentary front perspective view corresponding to FIG. 4, wherein the front access door is shown in the unlocked and open position allowing access to the user accessible components.
Figure 6:
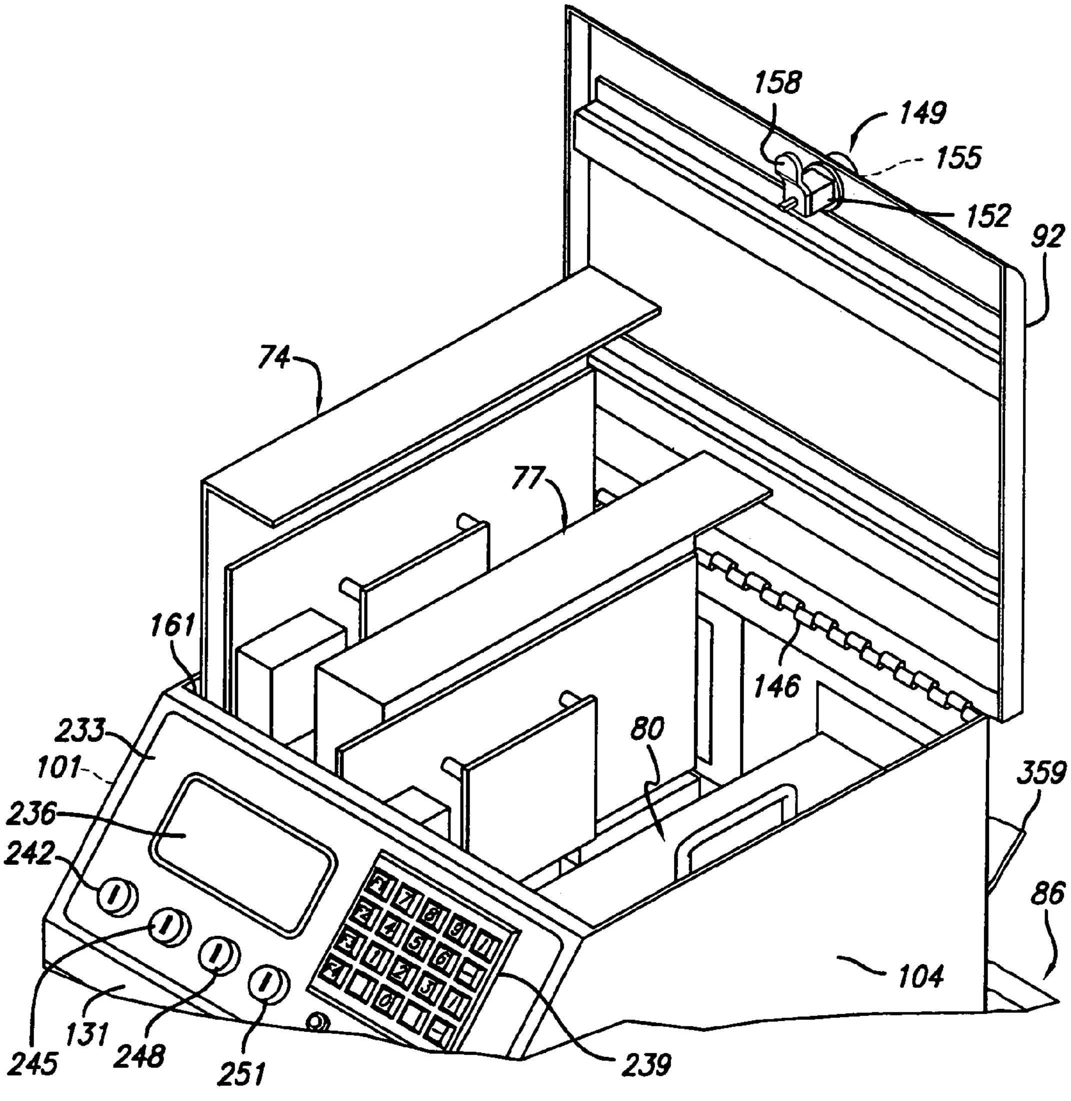
FIG. 6 is substantially a fragmentary side perspective view wherein the top access door is shown in the unlocked and open position allowing access to the processor boards and the power supply.
Figure 7:
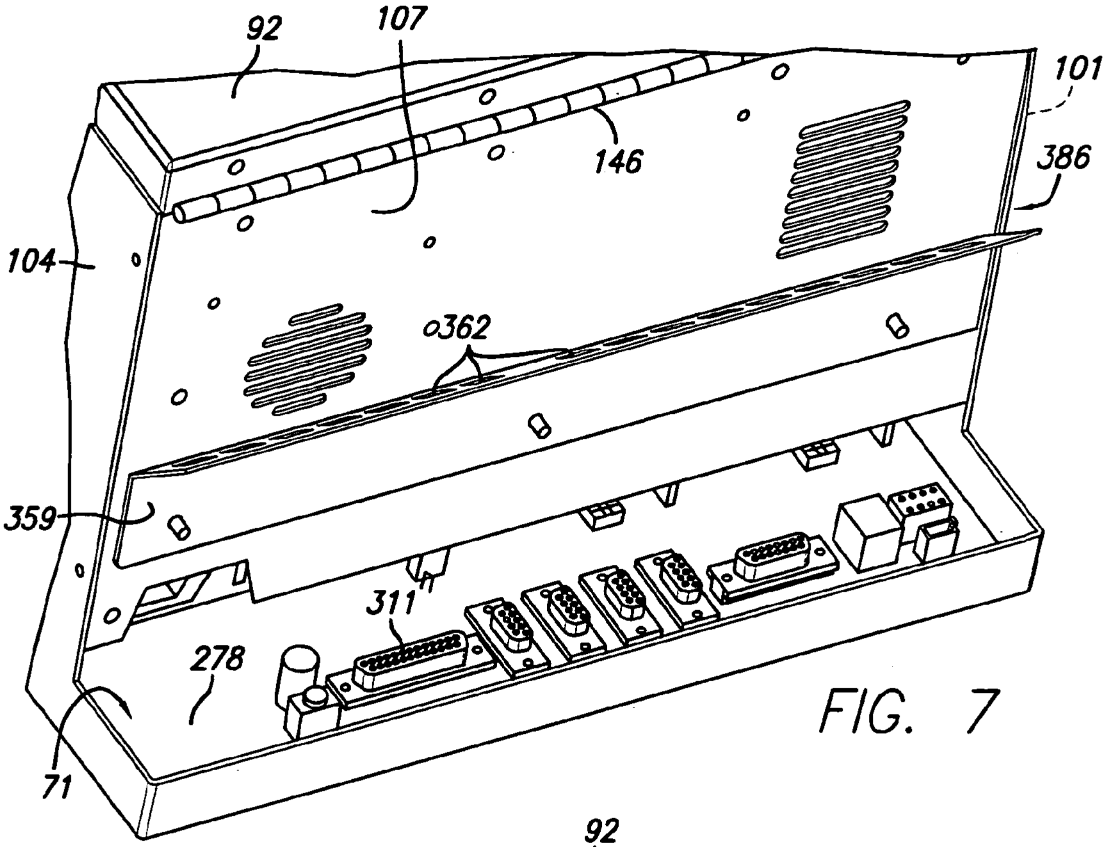
FIG. 7 is substantially a rear perspective view of the main cabinet and the main circuit board, without the attached base.

Referring to FIG. 4, control panel 68 provides administration and configuration access as well as displays system status. Control panel 68 comprises a plate 233, a vacuum fluorescent display (VFD) 236, a keypad 239, a plurality of rotary key switches 242, 245, 248, and 251, a power indicator light emitting diode (LED) 254, and a plurality of status indicator LED's 257. VFD display 236 is a four line by twenty character long display capable of displaying information such as the system operation and status, software revision information, configuration data, or any other message programmed into the software. Keypad 239 includes a plurality of function keys 260, arrow keys 263, digit keys 266, and delete keys 269. Keypad 239 is the primary input device for administration level data. Each rotary key switch 242, 245, 248, and 251 are individually keyed (require a separate key to activate/deactivate the switch) and provide a means to switch to high security modes for administration and debugging. The power indicator LED 254 indicates whether the system has power, and the status indicator LED's 257 indicate communications and other status of the system. A control panel wire harness (not shown) extends rearwardly from control panel 68 interconnecting the various components thereof to the other electronics.

Main circuit board 71 includes a front portion 272, a middle portion 275, and a rear portion 278. Front portion 272 includes compact flash ROM connectors 281 and 284 into which are plugged a pair of respective compact flash ROM cards 287 and 290 (one for each processor) which provide a means for information storage and custom game templates, and keyboard connectors 293 and 296 (one for each processor) which allow super user input to the processors. The rear portion 278 of main circuit board 71 is where all of the external connections are made to game controller 59 and main circuit board 71. These include, for example, CAS printer parallel port connector 311, which is a standard printer parallel port capable of operating most printers Main circuit board 71 slides into main cabinet 83 and is secured therein such as by screws (not shown). In such mounted condition, front portion 272 of main circuit board 71 is adjacent front access door 89 and rear portion 278 thereof extends onto rearwardly extending portion 116 of main cabinet 83. Therefore, just behind front access door 89 lies access to the wire harness (not shown) of front control panel 68, as well as to the user accessible components such as the compact flash ROM cards 287 and 290, and keyboard connectors 293 and 296. At rearwardly extending portion 116, connectors including CSA parallel printer port connector 265 are accessible when main cabinet 83 is in the open position.

Figure 8:
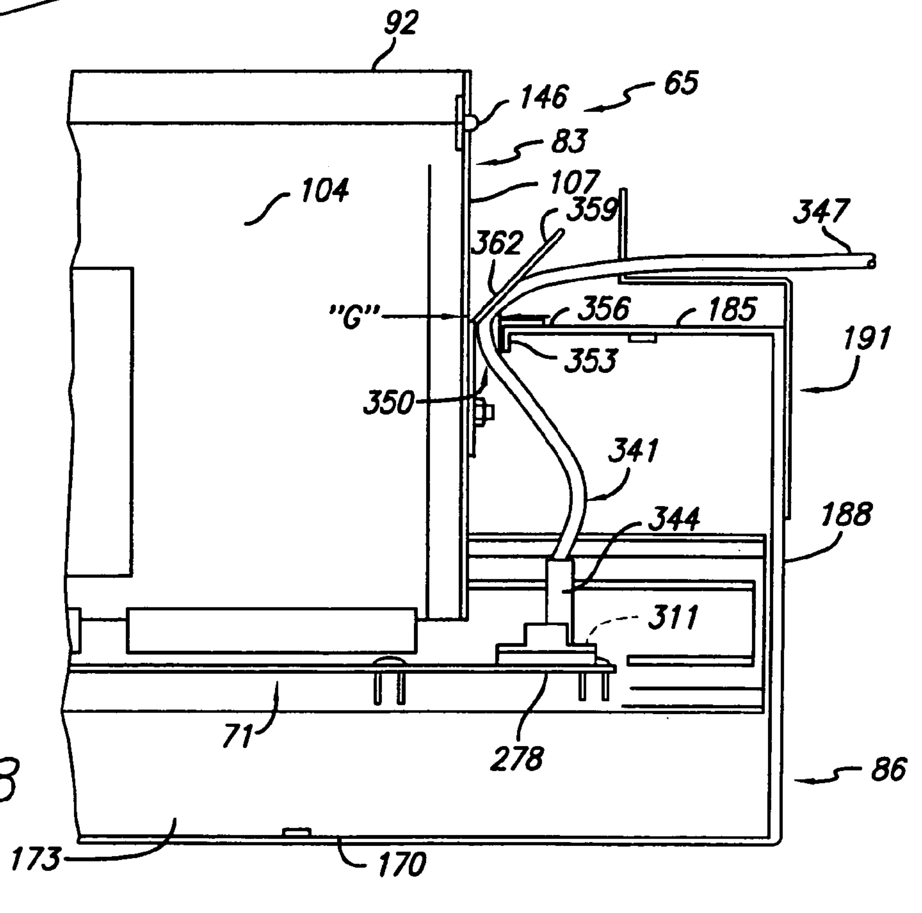
FIG. 8 is substantially a fragmentary longitudinal vertical sectional view showing the details of the rear cable enclosure structure.

Referring to FIG. 8, rear wall 107 and rearwardly extending portion 116 of main cabinet 83 work in conjunction with enclosure structure 191 to prevent the removal or theft of cables such as a parallel cable assembly 341, which includes a parallel port connector 344 and a connected sleeved wire cable 347. After unlocking base 86, sliding main cabinet 83 forward, and connecting cable assembly 341 such as to CAS printer parallel port connector 311, main cabinet 83 is moved to the closed position shown and locked. Cable 347 extends through a transverse opening 350 formed between rear wall 107 of main cabinet 83 and a downwardly directed lip 353 of end portion 356 of partial top wall 185 of base 86. With main cabinet 83 in such closed position, opening 350 is slightly larger than the diameter of cable 347 so as not to be pinched, but small enough so as to not pass connector 344, effectively retaining cable assembly 341 to main cabinet 65 until base 86 is unlocked and main cabinet 83 moved forward to open.

An angled bracket 359 having a plurality of generally vertically disposed, parallel slots 362 can be affixed to rear wall 107 of main cabinet 83, with cable 347 bending into a respective slot 362 to laterally retain cable 347 as main cabinet 83 moves forward and backward during use.

Figure 9:
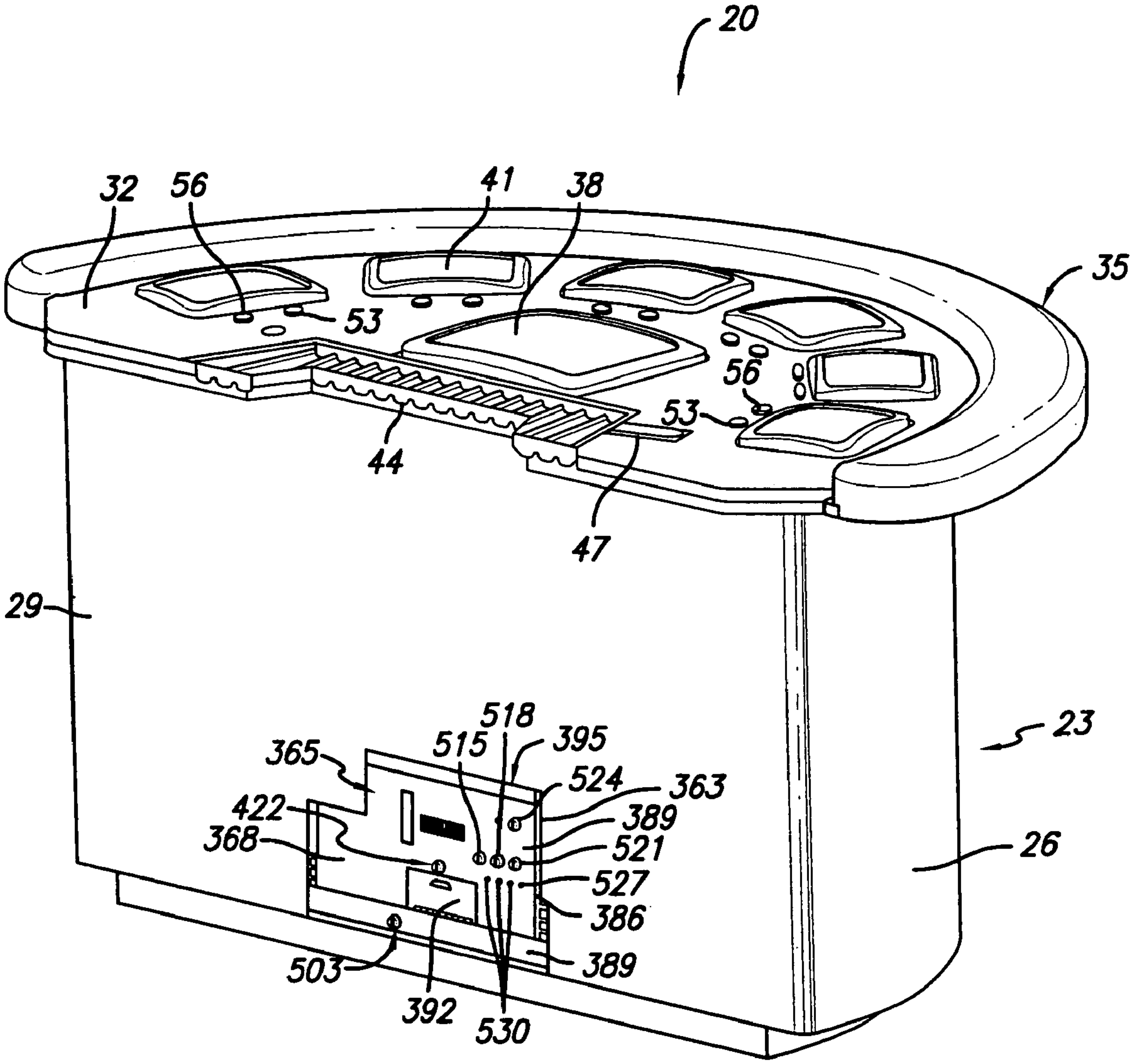
FIG. 9 is substantially a rear perspective view of an electronic gaming table similar to that of FIGS. 1 and 2, but modified to use a second embodiment security cabinet of the invention having a side cable enclosure structure.
Figure 10:
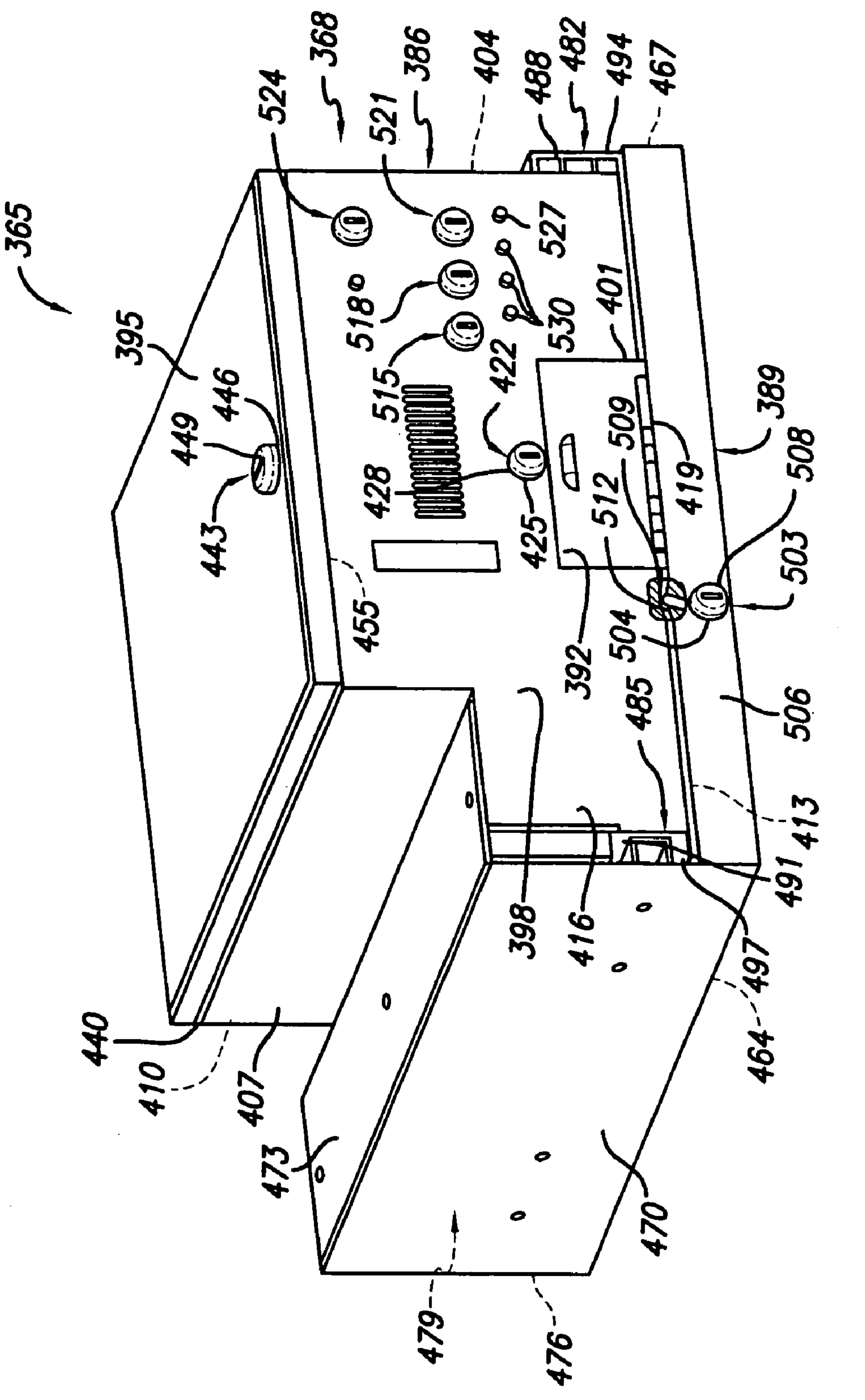
FIG. 10 is substantially a front perspective view of such second embodiment security cabinet.

Referring to FIG. 9, therein is shown gaming table 20, but using a second version game controller of similar design to first version game controller 59, but having side cable access and locking rather than rear, being disposed in a recess 363 of slightly modified design from recess 62. As shown in FIGS. 10–13, the second version game controller 365 comprises a second embodiment security cabinet 386, a control panel 371, a main circuit board 374, a central game server (CGS) computer module 377, a central accounting server (CAS) computer module 380, and a power supply 383. Security cabinet 368 comprises a main cabinet 386, abase 389, a front access door 392, and a top access door 395. Main cabinet 386 comprises a front wall 398 having a rectangular opening 401, a pair of side walls 404 and 407, a rear wall 410, a bottom wall 413 interconnecting side walls 404 and 407, and a laterally extending portion 416. Front access door 392 is pivotally mounted to bottom wall 413 by means of a first piano hinge 419 and which is retainable in a closed position by means of a first rotary key lock 422 having a body 425 mounted to front wall 398, and a rotatable cylinder 428 into which a key (not shown) is inserted, with an attached locking tab 431 which rotates into a corresponding slot 434 of an upper cross member 437 of front access door 392.

Top access door 395 is pivotally mounted to rear wall 410 by means of a second piano hinge 440 and which is retainable in a closed position by means of a second rotary key lock 443 having a body 446 mounted to top access door 395, and having a rotatable cylinder 449 with attached locking tab 452 which rotates to a position under an edge portion 455 of front wall 398. A gas spring 458 connected to respective pins 461 retains top access door 395 in the open position.

Base 389 comprises a lower wall 464 which interconnects a pair of side walls 467 and 470, which are interconnected by a partial top wall 473, and a rear wall 476 so as to comprise a cable enclosure structure 479 which, in conjunction with rear wall 410 of main cabinet 386 prevents the unauthorized removal or the theft of cables. Main cabinet 386 is slidably mounted to base 389 by means of a pair of slides such as ball bearing drawer slides 482 and 485 having respective upper slide members 488 and 491 and lower slide members 494 and 497, upper slide members 488 and 491 being affixed to the exterior of respective side walls 404 and 407 of main cabinet 386, and lower slide members 494 and 497 being affixed to the interiors of respective side walls 467 and 470 of base 386. Main cabinet 386 can be retained in a closed position, by means of a third rotary key lock 503 having a body 504 mounted to an upstanding front lip 506 of lower wall 464 and having a rotatable cylinder 508 with attached locking tab 509 which rotates into a transverse slot 512 through lower wall 413 of main cabinet 386.

Figure 11:
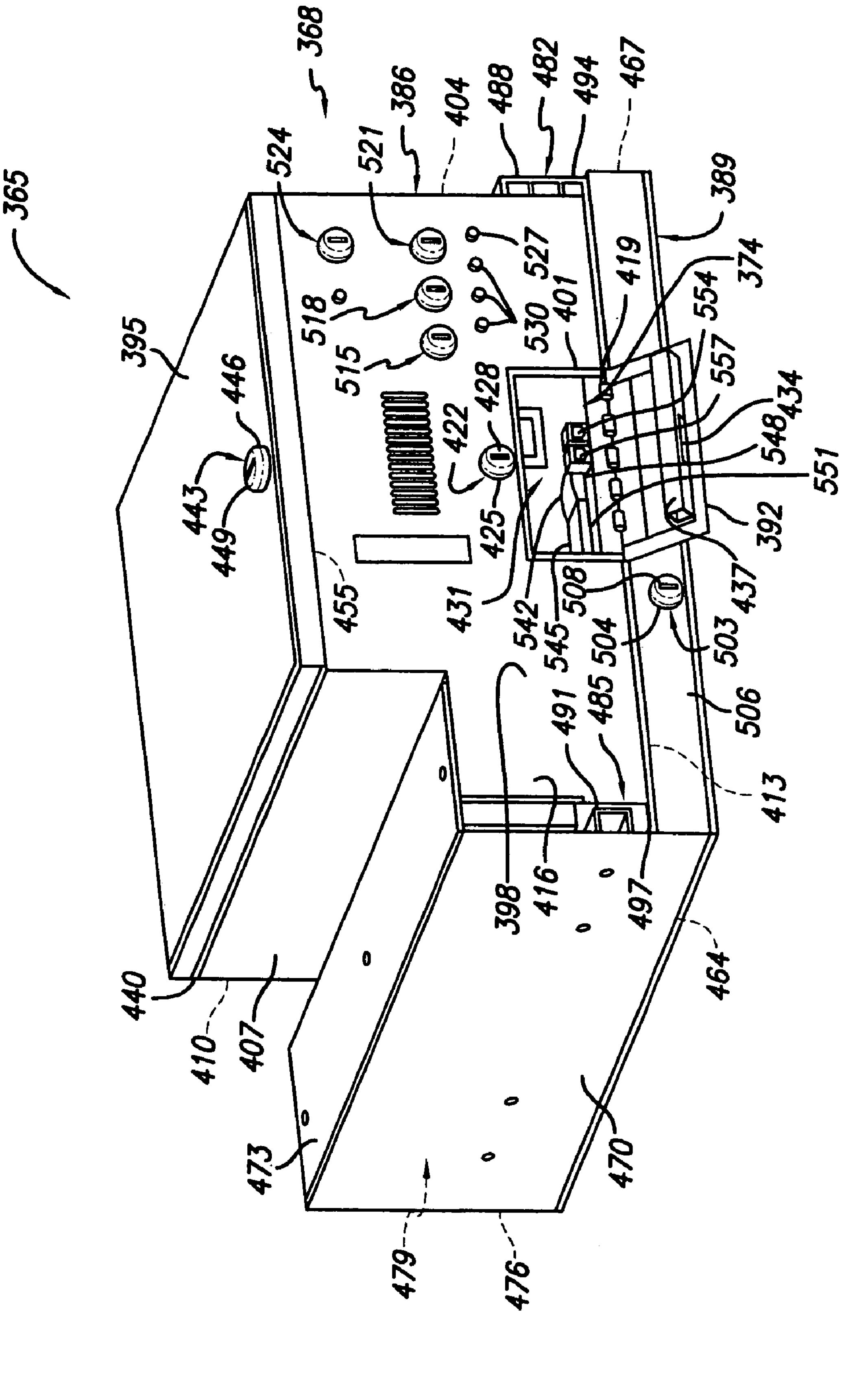
FIG. 11 is substantially a front perspective view corresponding to FIG. 10, but wherein the front access door is in the open position.
Figure 12:
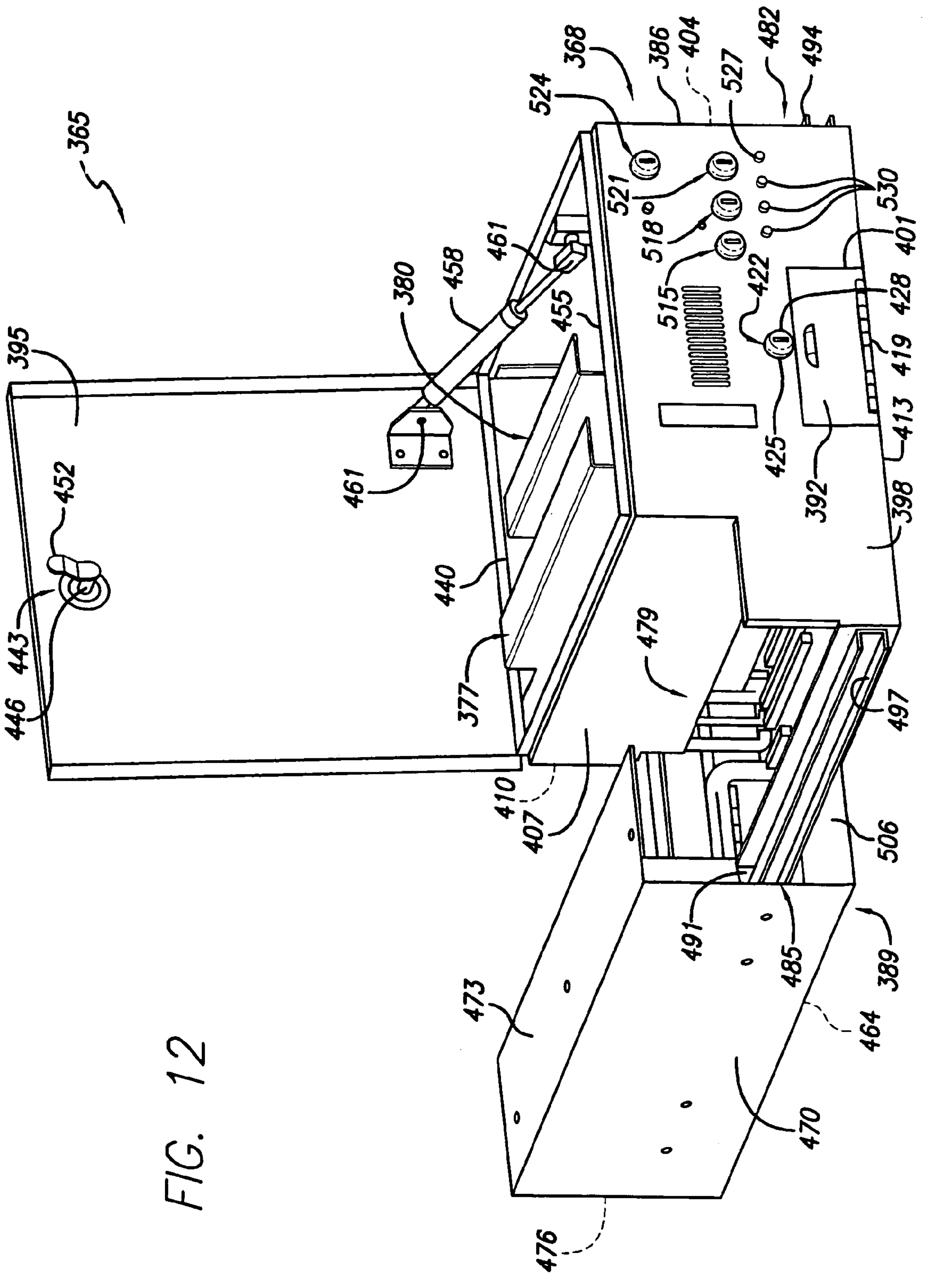
FIG. 12 is substantially a front perspective view corresponding to FIGS. 10 and 11 wherein the top access door is in the open position and the main cabinet is in the forward or extended position.
Figure 13:
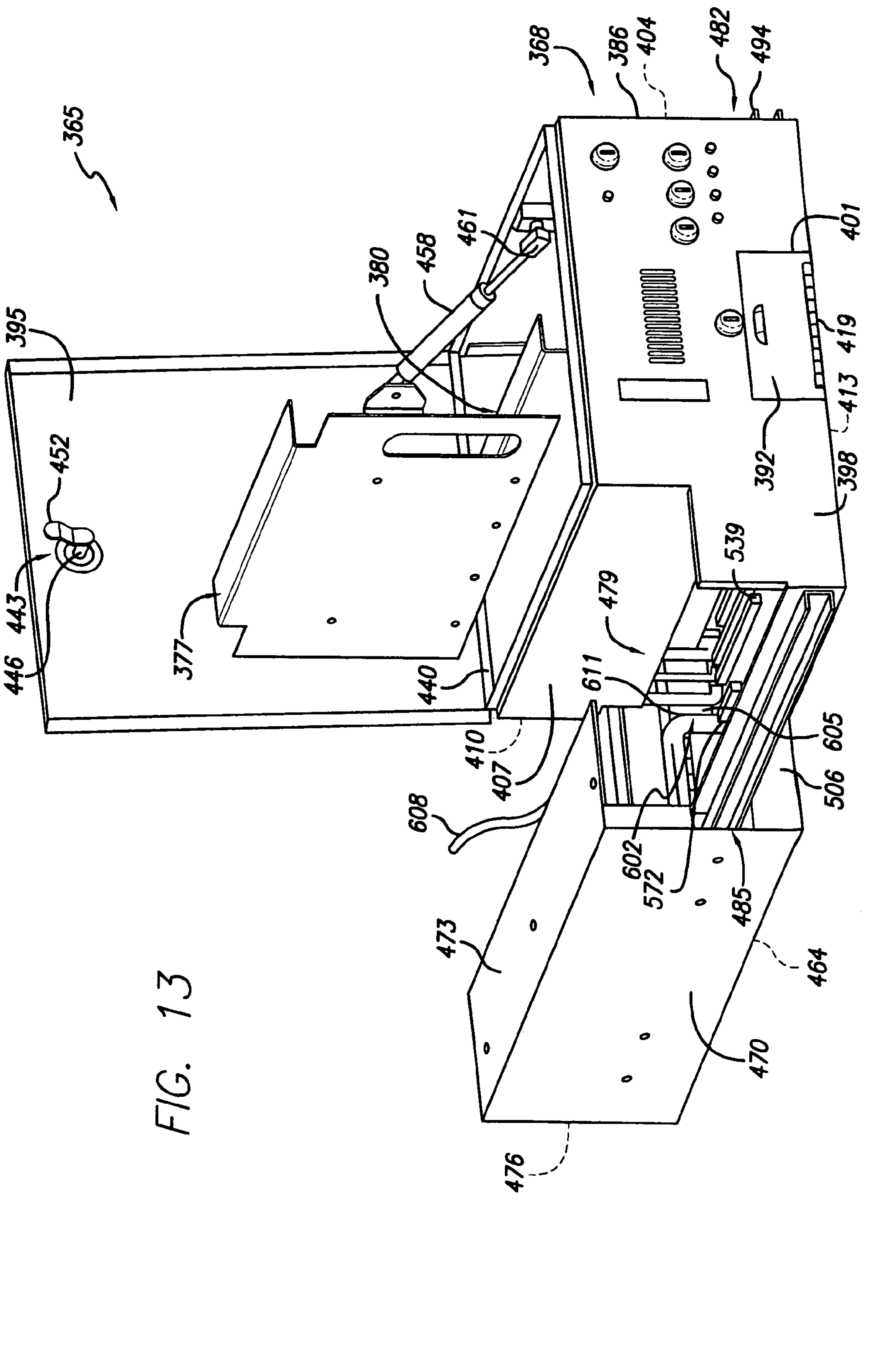
FIG. 13 is substantially a front perspective view corresponding to FIG. 12, wherein a processor board is partially removed.

Referring to FIG. 11, front wall 398 provides administration and configuration access as well as displays system status through a plurality of rotary key switches 515, 518, 521, and 524, a power indicator light emitting diode (LED) 527, and a plurality of status indicator LED's 530. Each rotary key switch 515, 518, 521, and 524 are individually keyed and provide a means to switch to high security modes for administration and debugging. The power indicator LED 527 indicates whether the system has power, and the status indicator LED's 530 indicate communications and other status of the system. A control panel wire harness (not shown) extends rearwardly from front control panel 62 interconnecting the various components thereof to the other electronics.

Main circuit board 374 includes a front portion 533, a middle portion 536, and a rear portion 539. Front portion 533 includes compact flash ROM connectors 542 and 545 into which are plugged a pair of respective compact flash ROM cards 548 and 551 (one for each processor) which provide a means for information storage and custom game templates, keyboard connectors 554 and 557 (one for each processor) allow super user input to the processors. Main circuit board 374 slides into main cabinet 386 and is secured therein. In such mounted condition, front portion 533 of main circuit board 374 is adjacent to front access door 392 and side portion 539 thereof extends onto laterally extending portion 416 of main cabinet 386. Therefore, just behind front access door 392 lies access to the wire harnesses (not shown), and the user accessible components such as compact flash ROM cards 548 and 551, and keyboard connectors 554 and 557. At laterally extending portion 416 of main cabinet 386 are connectors such as CAS printer port connector 572 which are accessible when main cabinet 386 is in the open position.

Referring to FIGS. 10–13, laterally extending portion 416 of main cabinet 386 acts as a lock to prevent the removal or theft of cables such as a parallel cable assembly 602, which includes a parallel port connector 605 connected to a sleeved wire cable 608. After unlocking base 389 and connecting parallel cable assembly 602 such as to CAS printer parallel port connector 572, main cabinet 386 is moved to the closed position shown and locked. Cable 608 extends through a vertical opening 611 formed between rear wall 476 of base 389 and rear wall 410 of main cabinet 386. With main cabinet 386 in such a closed position, vertical opening 611 is of a gap "G1" which is slightly larger than the diameter of cable 608 so as not to be pinched, but small enough so as to not pass connector 605, effectively retaining cable assembly 602 to game controller 365 until base 389 is unlocked and main cabinet 386 is moved forward to open.

An angled bracket (not shown) having a plurality of generally vertically disposed, parallel slots of similar design to bracket 359 can be affixed to rear wall 410 of main cabinet 386, with cable 608 bending into a respective slot thereof to laterally retain cable 608 as main cabinet 386 is moved forward and rearward on base 389 during use.

Many variations of the lockable security cabinet can be made while staying within the same inventive concept. For example, the access members can be plates which are removably, lockably connectable to the main cabinet rather than being doors pivotally connected thereto The access members can be located anywhere desired to access the desired components therein. Other locks can be used than the cylinder type rotary key locks, with electronic locks which use a code rather than a physical code can likewise be used.

CONCLUSION

The lockable security cabinet for casino game controllers provides access security never before available in prior art enclosures for game controllers by permitting only authorized persons to access specific controls, electronics, and cable connectors inside the game controller. This high security is provided in an easily accessible package with convenient access to the game controller electronics and cable assemblies by means of the slide-out design of the main cabinet with the base recessed in the gaming table or other enclosure, the plurality of access doors, and the slide opening design of the cable enclosure.

Although the description above contains many specifications, these should not be construed as limiting the scope of the invention but as merely providing illustrations of some of presently preferred embodiments of this invention. Thus, the scope of the invention should be determined by the appended claims and their legal equivalents rather than by the examples given.

We claim:

1. A lockable security cabinet capable of providing multiple levels of security comprising:

(A) a main cabinet;

(B) a plurality of enclosable inner compartments located within the main cabinet;

(C) a base; wherein the main cabinet is moveably attached to the base;

(D) an opening in the main cabinet or base, wherein the opening is configured to allow a cable to pass and to prohibit removal of cable connectors when the main cabinet is maintained in an operating position inside the base;

(E) a plurality of access members connected to the main cabinet, wherein the plurality of access members limit access to the plurality of enclosable inner compartments when in a closed position;

(F) a first lock; wherein the first lock selectively secures at least one of the plurality of access members;

(G) a first key; wherein the first key is designed to operate the first lock;

(H) a second lock, wherein the second lock selectively secures at least one of the plurality of access members different from those secured by the first lock and wherein the second lock is not operated by the first key; and (I) a second key, wherein the second key operates the second lock.

2. The lockable security cabinet of claim 1 further comprising an electronic component disposed in the main cabinet and a display disposed on the main cabinet and in communication with the electronic component.

3. The lockable security cabinet of claim 1 further comprising an electronic component disposed in the main cabinet and an input device disposed on the main cabinet and in communication with the electronic component.

4. The lockable security cabinet of claim 1 further comprising an electronic component disposed in the main cabinet and an indicator disposed on the main cabinet and in communication with the electronic component, the indicator configured to provide a visual indication of the status of the electronic component.

5. The lockable security cabinet of claim 1 wherein at least one of the enclosable inner compartments secured by the first access member and first lock contains at least one cable assembly.

6. The lockable security cabinet of claim 1 wherein at least one of the enclosable inner compartments secured by the second access member and second lock contains a computer hardware component.

7. The lockable security cabinet of claim 1, further comprising a top access member disposed at the top of the main cabinet.

8. The lockable security cabinet of claim 7, further comprising a third lock for securing the top access member, wherein the third lock is not operated by the first or second key, and further comprising a key for operating the third lock, wherein the third lock key does not operate the first or second locks.

9. A lockable security cabinet capable of providing multiple levels of security comprising:

(A) a main cabinet;

(B) a plurality of enclosable compartments located within the main cabinet;

(C) a plurality of access members connected to the main cabinet, wherein the plurality of access members are capable of substantially limiting access to the plurality of enclosable compartments;

(D) a first lock associated with one of the access members; wherein the first lock is capable of securing at least one of the plurality of access members;

(E) a first key; the first key being configured to operate the first lock;

(F) a control panel located in the main cabinet, wherein the control panel allows an operator to access configuration or administrative functions of a computer;

(G) at least one key switch associated with the control panel, the key switch configured to limit access to at least one control panel function, wherein at least one key switch is not operated by the first key;

(H) a second key, the second key being configured to operate at least one of the plurality of key switches and which does not operate the first lock.

10. The lockable security cabinet of claim 9 further comprising a display disposed on the main cabinet and in communication with the computer.

11. The lockable security cabinet of claim 9 further comprising an input device disposed on the main cabinet and in communication with the computer.

12. The lockable security cabinet of claim 9 further comprising an indicator disposed on the main cabinet and in communication with the computer, the indicator configured to provide a visual indication of the status of the computer.

13. The lockable security cabinet of claim 9 further comprising a base; wherein the main cabinet is moveably attached to the base.

14. The lockable security cabinet of claim 13 wherein the main cabinet is slidable in a forward and backward mariner with respect to the base.

15. The lockable security cabinet of claim 13 further comprising a cable guide assembly, wherein the cable guide assembly is adapted to guide at least one cable when the main cabinet is actuated with respect to the base.

16. The lockable security cabinet of claim 13 further comprising a second lock, wherein the second lock selectively limits the main cabinet from being moved and wherein the second lock is not operated by the first or second key.

17. The lockable security cabinet of claim 9, further comprising a base, wherein the main cabinet is slidably connected to the base, the main cabinet being slidable between a first and a second position, the base comprising an enclosure structure, the enclosure structure and at least one of a plurality of partition walls of the main cabinet defining a cable gap, the cable gap being of a size capable of preventing a cable connector from passing through the gap when the main cabinet is in the first position, wherein the main cabinet and the base substantially enclose and retain a cable assembly when the main cabinet is in the first position and the cable assembly may be removed from the enclosure structure when the main cabinet is in the second position.

18. The lockable security cabinet of claim 9, further comprising a top access door providing access to the main cabinet.

19. The lockable security cabinet of claim 18, wherein the top access door is secured by a third lock, and wherein the third lock is not operated by the first or second key.

20. The lockable security cabinet of claim 9 wherein one of the plurality of enclosable inner compartments contains an electronic component, the electronic component in communication with the control panel and the key switch.

21. The lockable security cabinet of claim 9 further comprising a cable gap in the enclosable inner compartment containing a plurality of receptors, wherein the cable gap is adapted to allow cables having connectors to pass from outside the main cabinet to the inside of the main cabinet and be connected to the receptors, but not allow cable connectors to pass through the cable gap when the enclosable inner compartment is substantially enclosed.

22. A lockable security cabinet capable of providing multiple levels of security comprising:

(A) a main cabinet;

(B) a first enclosable compartment located within the main cabinet;

(C) a first access member connected to the main cabinet, wherein the first access member limits access to the first enclosable compartment when in a closed position;

(D) a first lock associated with the first access member; the first lock selectively securing the first access member;

(E) a first key; the first key being configured to operate the first lock;

(F) a control panel, wherein the control panel allows an operator to access configuration or administrative functions of a computer;

(G) a first key switch disposed on the main cabinet and associated with the control panel, the first key switch configured to limit access to a control panel function, wherein the first key switch is not operated by the first key; and (H) a second key, wherein the second key is configured to operate the first key switch and not to operate the first lock.

23. The lockable security cabinet of claim 22, further comprising:

(A) a second enclosable compartment located within the main cabinet;

(B) a second access member connected to the main cabinet, wherein the second access member is limits access to the second enclosable compartment when in a closed position;

(C) a second lock associated with the second access member, the second lock selectively secure the second access member, and wherein the second lock is not operated by the first or second key; and (D) a third key, the third key being configured to operate the second lock, and wherein the third key does not operate the first lock or the first key switch.

24. The lockable security cabinet of claim 23 wherein the second enclosable compartment contains an electronic component, the electronic component in communication with the control panel and the key switch.

25. The lockable security cabinet of claim 22 further comprising a base to which the main cabinet is movably attached, wherein the main cabinet is moveable in a backwards and forwards manner with respect to the base and wherein the main cabinet can be secured against movement relative to the base by using a lock.

26. The lockable security cabinet of claim 25 further comprising an opening in the main cabinet or base configured to allow a cable to pass through and configured to prevent cable connectors from passing through when the main cabinet is locked within the base.

27. The lockable security cabinet of claim 22 further comprising a display disposed on the main cabinet and in communication with the computer.

28. The lockable security cabinet of claim 22 further comprising an input device disposed on the main cabinet and in communication with the computer.

29. The lockable security cabinet of claim 22 further comprising an indicator disposed on the main cabinet and in communication with the computer, the indicator configured to provide a visual indication of the status of the computer.

30. A lockable security cabinet comprising:

(A) a cabinet;

(B) a plurality of compartments located within the cabinet, wherein a portion of the compartments are secured by a plurality of locks, wherein each lock is operated by a key, and wherein each lock is operable by at least one key that is unique;

(C) a control panel located in the cabinet, wherein the control panel provides access to at least one computer function; and (D) a lock associated with the control panel, the lock configured to limit access to at least one computer function, wherein the lock is operated by at least one key that is unique.

31. The lockable security cabinet of claim 30 wherein an access compartment secures at least one electronic component and a second compartment secures at least one cable receptor.

32. The lockable security cabinet of claim 30 wherein an access compartment secures at least one electronic component, the electronic component in communication with the control panel and the key switch.

33. The lockable security cabinet of claim 30 further comprising a display disposed on the main cabinet and in communication with the computer.

34. The lockable security cabinet of claim 30 further comprising an input device disposed on the main cabinet and in communication with the computer.

35. The lockable security cabinet of claim 30 further comprising an indicator disposed on the main cabinet and in communication with a computer, the indicator configured to provide a visual indication of the status of the computer.

36. A lockable security cabinet comprising:

(A) housing means for holding items;

(B) a plurality of compartment means for subdividing the housing means and holding items;

(C) a plurality of access limiting means for selectively limiting access to the compartment means, wherein the access limiting means are coupled to the housing means;

(D) a plurality of locking means for securing at least one of the plurality of the access limiting means; and (E) a plurality of unique key means for unlocking the plurality of locking means, wherein each unique key means corresponds to one of the plurality of locking means to provide multiple security levels.

37. The lockable security cabinet of claim 36 further comprising a display means for displaying information disposed on the housing, the display means being in communication with a processor means for receiving, processing, and transmitting data, the processor means disposed within the housing.

38. The lockable security cabinet of claim 36 further comprising an input means for allowing an operator to configure a processor means for receiving, processing, and transmitting data, the input means disposed on the housing, the processor means disposed in the housing.

39. The lockable security cabinet of claim 36 further comprising an indicator means for providing a visual indication of the status of a processor means for receiving, processing, and transmitting data, the indicator means disposed on the housing, the processor means disposed in the housing.

* * * * *

UNITED STATES PATENT AND TRADEMARK OFFICE

CERTIFICATE OF CORRECTION

PATENT NO. : 7,108,606 B1

APPLICATION NO. : 11/134903

DATED : September 19, 2006

INVENTOR(S) : Robert A. Luciano, Jr., Michael Souza and Kurt W. Spencer

It is certified that error appears in the above-identified patent and that said Letters Patent is hereby corrected as shown below:

On Title Page Item (57)
Abstract
On line 12, replace “enclosure allowing” with --enclosure.--
On line 13, replace “access” with --Access--
On line 13, replace “an disconnecting of ends of” with --disconnect the ends of the--
On line 14, replace “only” with --is only allowed--

Column 5
On line 16, after “position” insert --.--[period]
On line 17, indent new paragraph from “Base 86”

Column 8
On line 22, after “thereto” Insert --.--[period]

Column 10
On line 12, replace “mariner” with --manner--

Column 11
Online 17, delete “is”
On line 21, replace “secure” with --secures--

Signed and Sealed this

Second Day of January, 2007

JON W. DUDAS
*Director of the United States Patent and Trademark Office*